United States Patent [19]

Bird

[11] Patent Number: 4,760,326

[45] Date of Patent: Jul. 26, 1988

[54] PROTECTIVE HOUSING AND MOUNTING APPARATUS FOR CAPACITIVE-TYPE PROXIMITY SENSOR

[75] Inventor: Charles R. Bird, Milford, Ind.

[73] Assignee: CTB, Inc., Milford, Ind.

[21] Appl. No.: 944,934

[22] Filed: Dec. 22, 1986

[51] Int. Cl.[4] .......................... G01R 27/26; H01G 7/00
[52] U.S. Cl. ............................ 324/61 P; 200/DIG. 1; 361/179
[58] Field of Search .............. 324/61 R, 61 P; 340/59, 340/520; 73/304 C, 304 R; 174/35 MS; 361/179, 180, 331, 280; 200/82 R, DIG. 1

[56] References Cited

U.S. PATENT DOCUMENTS

| | | | |
|---|---|---|---|
| 3,047,801 | 7/1962 | Dietert | 324/61 P |
| 3,586,972 | 6/1971 | Tulleners | 324/61 R |
| 3,628,136 | 12/1971 | Jonas | 324/61 R |
| 4,047,434 | 9/1977 | Marsh et al. | 73/304 R |
| 4,168,466 | 9/1979 | Boldt | 324/61 P X |
| 4,486,811 | 12/1984 | Kamiya et al. | 361/280 |

OTHER PUBLICATIONS

Gordon Products, Inc., Bulletin SW-2, Capacitive Proximity Switches, Models PC 131/132 All Material Sensing, 1/1983.

*Primary Examiner*—Reinhard J. Eisenzopf
*Assistant Examiner*—Jack B. Harvey
*Attorney, Agent, or Firm*—Trexler, Bushnell, Giangiorgi & Blackstone, Ltd.

[57] ABSTRACT

A protective housing and mounting apparatus for simultaneously protectively enclosing, and mounting to a given surface, a generally cylindrical capacitive-type proximity sensor having a substantially solid and unbroken external surface and an electrode member at one axial end thereof. The protective housing and mounting apparatus comprises a one-piece integrally formed member of a durable, moldable plastics material, including an end surface configured for complementary mounting upon a given surface and a protective body portion extending from this end surface for surroundingly housing an end part of the sensor proximate the axial end thereof at which the electrode member is located. The body portion has a cylindrical open-ended bore therein for receiving an end part of the sensor and this bore extends to a point closely spaced behind the end surface. A quantity of conductive material covers substantially all external surfaces of the body portion and a predetermined portion of the end surface away from the periphery thereof, such that there is no continuity of electrically conductive material between the end surface and the body portion surfaces. An arrangement is provided for establishing electrically conductive contact between the end surface conductive material-covered portion and the electrode of the sensor, such that the end surface conductive portion defines an electrode of selected size and configuration for the sensor.

9 Claims, 2 Drawing Sheets

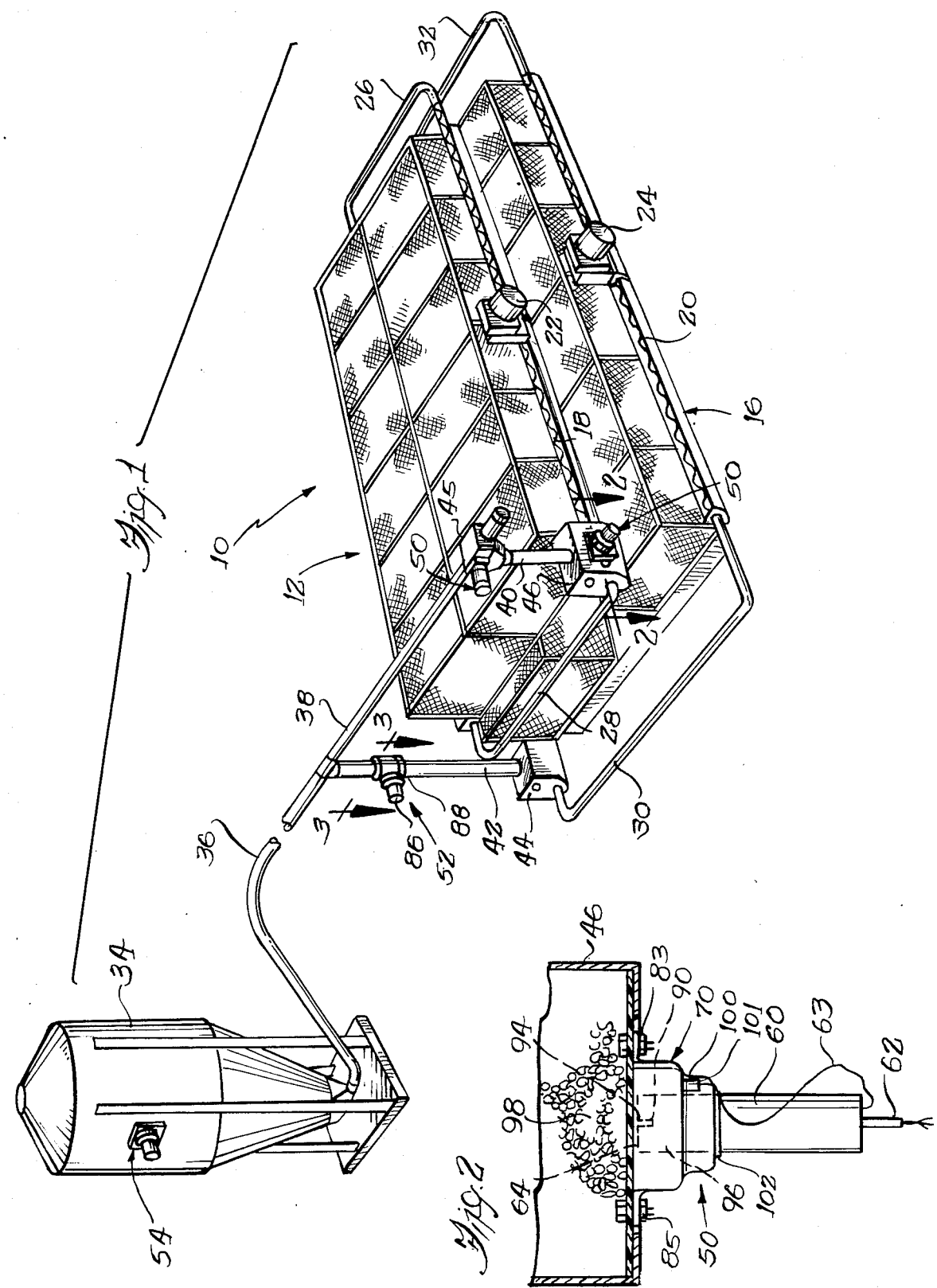

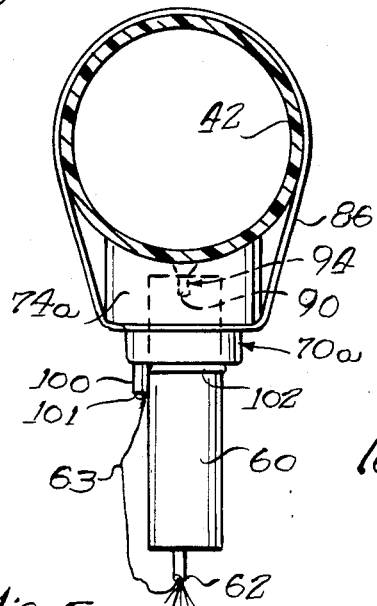
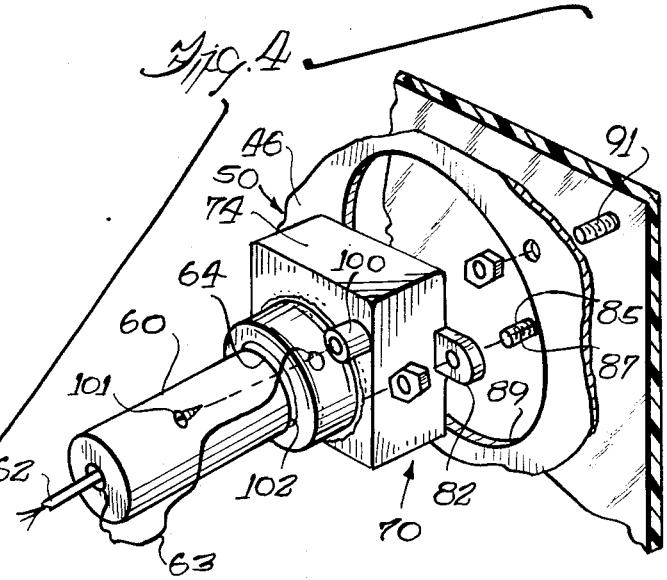
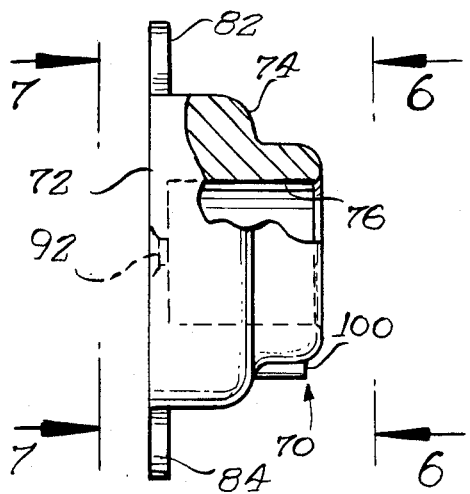
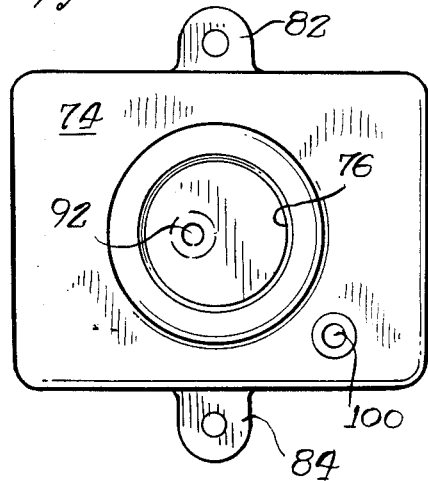
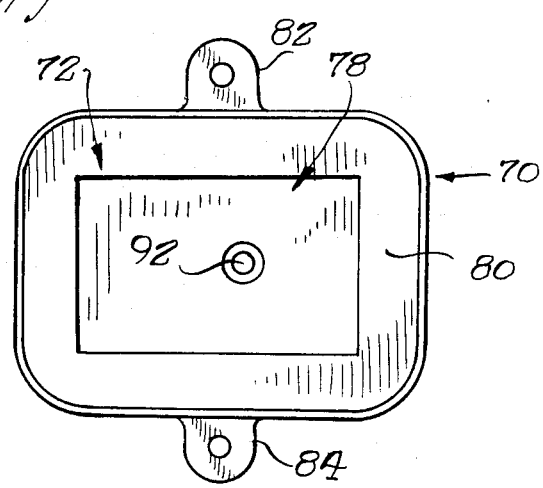
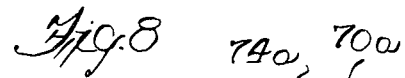
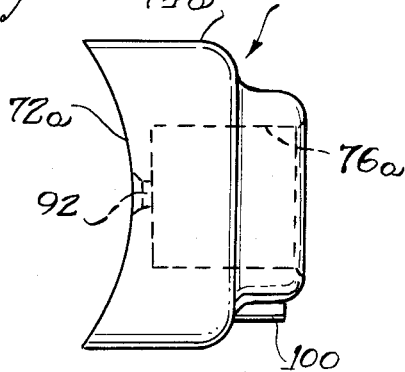

PROTECTIVE HOUSING AND MOUNTING APPARATUS FOR CAPACITIVE-TYPE PROXIMITY SENSOR

BACKGROUND OF THE INVENTION

This invention is directed generally to a novel and improved capacitive type proximity sensor, and more particularly to a novel combined protective housing and mounting apparatus for mounting a proximity sensor to a given surface.

While the present invention may be used in a variety of applications, the description will be facilitated by specific reference to the problem of monitoring the flow and level of feed material in a livestock feed delivery system. Modern livestock operations utilize extensive and often automated feeding systems for delivering feed to large numbers of livestock housed in confinement structures or buildings. Such feeding systems may be utilized in hog-raising operations as well as in chicken raising or laying operations, to deliver feed to the confined animals. Such feeding systems generally comprise one or more feed storage bins or hoppers which may be located exteriorly of one or more livestock buildings or confinement structures for holding a supply of feed for use over an extended period of time. Delivery of feed to the building or confinement structure may be by way of one or more tubular conduits, often with auger-like or other drive elements therein for advancing the feed. Once in the confinement structure, a series or system of similar, generally tubular auger conveyors delivers the feed to a system of individual feeding trays or pans, to continuous trough systems, or to other animal feeding apparatus. Generally speaking, portions of the conveyor systems are overhead, so as to deliver feed generally horizontally along or around the building, and then by gravity, through generally vertical drop tubes to the individual troughs, containers or the like. Moreover, additional intermediate hoppers, or metering devices may be utilized at some points in the system such as along the drop tubes intermediate the overhead delivery conduits and the troughs or individual feeding pans or the like.

Attempts have been made to monitor the flow and/or level of feed at various points in such a feed delivery system. For example, if a given point in the system should become clogged or overfilled, such that feed begins to back up in a drop tube or other part of the system, feed delivery should be shut off to all or part of the system until the conditions causing the backup are corrected. On the other hand, if feed fails to reach some part of the system, the absence of feed should similarly be detected an indicated to an operator so that appropriate corrective action may be taken.

We have attempted to sense the presence or absence of feed at various points in the delivery system by the use of capacitance or capacitive-type proximity sensors or switching devices. Generally speaking, such devices sense changes in the dielectric properties or capacitance of an area adjacent an electrode or sensor plate element thereof for switching between open circuit and closed circuit conditions. These open circuit and closed circuit conditions may readily be detected as corresponding changes in voltage or current in a connected monitoring circuit, and utilized to control upstream or downstream equipment, or to alert an operator, as desired.

However, we have found available sensors of this type to be lacking in reliability in the typical livestock operation environment. That is, we have found the performance of such sensors to be adversely affected by conditions of humidity, dirt and the like which are found in the typical livestock operation. For example, the temperature and humidity often varies greatly between the outside bins or hoppers and the more controlled temperature and humidity conditions inside the livestock buildings. Especially during cold weather, the cold feed conveyed into the building from the outside bins causes considerable condensation on the external surfaces of the delivery conduits and related equipment as it pases therethrough. In an animal-filled barn, it will be appreciated that the temperature and humidity levels will be relatively elevated. Hence, relatively cold feed delivered from outside quickly cools the delivery equipment below the dew point and moisture condenses onto the equipment, often to the point of being literally "dripping wet".

Moreover, the feed itself may vary greatly in its moisture content, due to inherent variations in the moisture content of various feeds, as well as the storage conditions and the weather conditions as discussed above. It should be appreciated that such variations in moisture conditions and/or content effect the dielectric properties of the feed. This in turn effects the performance of the capacitive-type sensor which is intended to operate based upon sensed changes in dielectric properties of an adjacent electrical field to sense the presence or absence of feed.

Such variation of the dielectric properties of the feed may greatly diminish the reliability of the desired switching operation of such a sensor. For example, in the case of sensing the backup of feed in a drop tube, it will be appreciated that the sensor must not switch or change conditions while the feed is moving or falling in the drop tube. However, when the feed backs up in the drop tube due to filling or blockage of downstream equipment, the switch must then reliably trigger or change conditions to either give an appropriate signal to an operator or directly operate appropriate upstream equipment for corrective action. Hence, sensitivity of such a capacitive-type switch or sensor to environmental conditions can greatly decrease the desired reliability of operation thereof, given the relatively limited range of dielectric variation over which operation is desired in such applications.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures in which like reference numerals identify like elements, and in which:

FIG. 1 is a perspective view, somewhat diagrammatic in form, of a feed delivery system for a livestock confinement structure in connection with which the present invention may advantageously be utilized;

FIG. 2 is an enlarged, partial sectional view taken generally in the plane of the line 2—2 of FIG. 1 and showing an improved proximity sensor provided with a novel and improved housing and mounting apparatus in accordance with one form of the invention;

FIG. 3 is an enlarged, partial sectional view taken generally in the plane of the line 3—3 of FIG. 1 and showing the proximity sensor and housing and mounting apparatus in accordance with an alternate form of the invention;

FIG. 4 is an exploded perspective view illustrating assembly of a sensor element with the protective housing and mounting apparatus of the invention and mounting thereof to a given surface such as one of the surfaces illustrated in the feed delivery system of FIG. 1;

FIG. 5 is a side elevation, partially broken away and partially in section of the novel housing and mounting apparatus of FIG. 2;

FIG. 6 is a rear elevation taken generally in the plane of the line 6—6 of FIG. 5;

FIG. 7 is a front elevation taken generally in the plane of the line 7—7 of FIG. 5; and FIG. 8 is a side elevation similar to FIG. 5, of the housing and mounting apparatus of FIG. 3.

DETAILED DESCRIPTION OF THE ILLUSTRATED EMBODIMENT

Referring now to the drawings and initially to FIGS. 1 through 3, the apparatus of the invention is most advantageously utilized in connection with a livestock feeding system such as a poultry confinement and feeding system indicated generally by reference numeral 10. It should be understood, however, that the invention may find utility over a broad variety of other applications as well. The illustrated poultry confinement and feeding system 10 utlizes an array of poultry confinement cages 12 which are arranged generally in straight lines in oppositely facing, pyramidal or stepped-back, multi-level configuration.

Accordingly, an automatic feeding system for delivering feed to this array of poultry cages includes, adjacent the faces of each of the rows of cages, an elongated, open-topped trough, such as illustrated troughs 14 and 16. Preferably, elongated auger-like conveyor members 18, 20 are placed in the troughs to carry feed therealong. Suitable driving means such as motors and associated drive components indicated generally at reference numerals 22, 24 are utilized to drive the augers relative to the troughs. In this regard, the augers may be elongated flexible members which are arranged in a continuous fashion or loop around the array of cages 12 so as to service the troughs at opposite sides thereof. Accordingly, suitable connecting conduits or tubes 26, 28 and 30, 32 may be utilized to provide this continuous path for the augers.

The feed is delivered to the troughs and conveyors from a feed storage hopper or container 34 which is often located externally of the confinement building or other structure within which the array of cages 12 is located. Accordingly, an elongate connecting conduit or tubular member 36, which may have a similar auger running therethrough, delivers feed from the external hopper 34 to the troughs 14, 16. To this end, the feed is preferably delivered by way of an overhead main feed delivery conduit or header 38, which feeds respective delivery or drop tubes 40, 42 for delivering feed to the respective troughs 14, 16. In order to control the delivery of feed from the drop tubes 40, 42 to the respective troughs 14, 16, intermediate drop boxes or metering assemblies 44, 45, 46 are provided. These drop boxes or metering assemblies assure that a relatively constant, desired amount of feed is delivered to the associated troughs, to fill tghe same to a preselected level.

From the foregoing, it will be appreciated that it is desirable to monitor both the flow and level of feed material at various points in the illustrated feed delivery system. We have previously attempted to sense the presence or absence of feed at various points in the delivery system, to thereby monitor the flow and level thereof, by use of capacitance or capacitive-type proximity sensors or switching devices. However, we have experienced problems with reliable operation of such sensors in the typical livestock operation environment. More specifically, we have found that the performance of such sensors is often adversely affected by conditions of humidity, dirt, excess moisture and the like which are found in the typical livestock confinement structure and related feed system. For example, the outside bin or hopper 34 is often at a different temperature and humidity than the more controlled conditions inside the livestock building. Hence, especially during cold weather, the cold feed conveyed into the building from the outside bin causes considerable condensation on the feed handling and delivery equipment inside the building. That is, the relatively cold feed often cools the feed delivery equipment below the dew point and moisture condenses thereupon, often to the point of being literally dripping wet.

It will be appreciated that such variations in moisture conditions can greatly affect the dielectric properties of both the feed and the areas of the delivery equipment adjacent the feed. This, in turn, affects the performance of the capacitive-type sensors utilized, since the sensors operate essentially in response to sensed changes in the dielectric properties of an adjacent electrical field.

Accordingly, and referring now also to the remaining figures of drawing, we have developed a protective housing and mounting apparatus for simultaneously protectively enclosing, and mounting to a given surface of the equipment, a generally cylindrical capacitive-type proximity sensor. For purposes of illustration, one such sensor and housing and mounting apparatus in accordance with the invention has been illustrated at each of the exterior bin 34, the drop tube 42, and the drop box 46. It will be understood, however, that sensors may be positioned at other or different points in the delivery system without departing from the invention. These sensors and their mounting apparatus are respectively indicated in FIG. 1 by reference numerals 50, 52 and 54.

Initially, it will be noted that the present invention contemplates at least two forms of such housing and mounting apparatus, namely, one form for mounting to substantially flat surfaces as indicated in FIG. 2 and a second form for mounting to curved surfaces as indicated in FIG. 3. However, the construction and features of the respective housings are substantially similar, whereby like reference numerals will be utilized throughout in the ensuing description to indicate like elements and features.

In this regard, it will be noted that the sensor mounting apparatus and sensor 50 are mounted to a flat, metallic or sheet metal wall of drop box 46, while sensor and mounting apparatus 52 are mounted to a generally cylindrical outer wall or surface of a plastic or other non-conductive material drop tube 42. The third sensor 54 may be of the generally flat-mounting type, since the diameter of hopper 34 is sufficiently great that the curvature in the area of the relatively smaller sensor and mounting apparatus is negligible. That is, the hopper 34 has been shown at greatly reduced size to facilitate illustration thereof in FIG. 1, and it will be understood that the relative size of the sensor and mounting apparatus 54 is, in fact, much smaller than indicated in the drawing, which is somewhat diagrammatic in this regard.

Referring now more particularly to FIGS. 2 through 8, it will be noted that the proximity sensor utilized comprises a generally right cylindrical, elongate member 60 which has a substantially continuous and unbroken surface. Respective electrical lead wires or cable 62, including a grounding wire 63, emanate generally from a rear surface thereof. The sensor 60 also has an electrode member (not shown) at the axial end surface 64 thereof, opposite the surface from which wires 62 emanate. Preferably, the proximity sensor 60 comprises a capacitance proximity switch of the type generally designated Model PC 131/132 "all materials sensing", manufactured by Gordon Products, Inc. 67 Del Mar Drive, Brookfield, Conn. 06804.

The protective housing and mounting apparatus in accordance with a first form of the invention is illustrated in FIGS. 2, 4 and 5 through 7 and designated generally by reference numeral 70. Preferably, the apparatus 70 is a one-piece integrally formed member which may be molded or otherwise formed from a durable, and preferably moldable, plastics material. The like parts and components of the similar mounting and housing apparatus illustrated in FIGS. 3 and 8 will be designated by like reference numerals together with the suffix a.

Advantageously, the mounting member 70, 70a includes an end surface 72, 72a configured for complementary mounting upon the given surface to which the sensor 60 is to be mounted. In this regard, the sensor 70 has a substantially flat end surface 72 for mounting to the substantially flat wall of drop box 46. However, the mounting member 70a has a substantially arcuately curved surface 72a of complementary form for mounting to the generally cylindrical surface of the drop tube 42.

Extending from this end wall or surface 72, 72a is a protective body portion 74, 74a for surroundingly housing an end portion of the sensor 60 proximate the axial end 64 thereof at which the electrode is located. This body portion 74, 74a has a generally cylindrical open-ended bore 76, 76a therein for receiving the sensor. This bore is preferably of complementary dimension for closely surroundingly engaging an end portion of the cylindrical sensor 60. Moreover, in order to hold the axial end part of the sensor at which the electrode is located relatively closely adjacent the surface to which it is mounted, the bore 76, 76a extends inwardly of the body portion 74, 74a to a point closely spaced behind the end surface 72, 72a.

In order to electrically shield the sensor 60, and particularly, the electrode portion thereof within the bore 76, 76a, substantially all external surfaces of the body portion 74, 74a are covered with a quantity of conductive material. This conductive material covering is preferably accomplished by means of chrome plating the body portion 74, 74a. In order to provide a relatively enlarged effective electrode or capacitor plate surface at the end surface 72, 72a, a quantity of similar conductive material covers a substantial portion 78, 78a of this end surface away from its periphery. This spacing of the conductive material from the periphery is such that there is no continuity of electrically conductive material between the end surface 72, 72a and the external surface portions of the body 74, 74a. The uncoated, plastic or other non-conductive material peripheral surface portion of the end surface 72 as indicated by reference numeral 80, surrounds the entire periphery of coated or conductive portion 78. Preferably, all of the conductive material is applied as a plating in a single plating operation, utilizing a suitable masking material or other means to preserve the uncoated peripheral surface portion 80.

In the embodiment of FIGS. 2 and 4, means are also provided in the form of a pair of outwardly extending through-apertured tabs or ears 82, 84 for mounting the housing 70 and the sensor 60 mounted therein to a non-metallic and preferably clear acrylic or polycarbonate mounting panel 81 laminated or otherwise fastened (as by screws 91) to the inside surface of drop box 46 or of hopper 34 as illustrated in FIGS. 2 and 4. Cooperatively, suitable threaded fasteners 83, 85 such as screws and nuts, may extend through the apertured tabs or ears 82, 84 and into receiving aligned apertures 87 provided therefor in the panel 81 as illustrated in FIG. 4. The metal wall of drop box 46 or of hopper 34 is provided with an enlarged aperture 89 to accommodate the housing 70 and its ears 82, 84 in this fashion.

It should be noted that the embodiment of FIGS. 3 and 8 may also be provided with such mounting tabs if desired. However, in the illustrated embodiment the housing and mounting apparatus 70a is shown mounted to the drop tube 42 by flexible band members 86, 88, such that additional mounting tabs are not provided on the body 74a. Moreover, it will be appreciated that the respective elevational views of the apparatus 70a shown in FIG. 8 are substantially identical to the views in FIG. 6 and FIG. 7, but without the respective tabs 82 and 84 affixed thereto. Preferably, however, when such tabs are provided, they are integrally formed with the body 74 or 74a.

In order to establish electrically conductive contact between the external electrode or plate portion 78 and the electrode portion of the sensor 60, additional connecting means are provided therebetween. Accordingly, the plated or conductive portion 78 of end surface 72 or 72a, defines an electrode or capacitor plate of selected size and configuration to achieve the desired electrical properties or response of the sensor 60 with which it is used.

More particularly, and referring to the drawings, the electrode portion of the sensor includes an internally threaded bore 90 of metallic or other conductive material extending inwardly of axial end surface 64 thereof. The connecting means comprises a through aperture 92 in the conductive material covered portion 78 of end surface 72, 72a which is located and shaped for alignment in registry with the threaded bore 90. A suitable fastener member such as a threaded screw-type fastener 94 is also provided. This latter fastener 94 is of a conductive material and preferably has a threaded shaft portion 96 for complementary engagement with the threaded bore 90 and an enlarged head portion 98 for electrically conductive contact with the conductive material covered portion 78 about the through aperture 92 therein. The aperture 92 may include a counterbore of complementary form to receive the head portion 98 therein.

Preferably, the body portion 74, 74a also includes a conductive grounding terminal or boss 100 for receiving the ground wire 63. The boss 100 may be internally threaded to accept a screw 101 for maintaining the desired connection with grounding wire 63.

In accordance with a preferred form of the invention, the moldable plastics material selected for formation of the protective housing and mounting apparatus is a platable ABS plastic, such as Borg Warner Cycolac EPB-3570 electroplatable ABS. Preferably, the chrome plating material coating the selected areas as described above comprises a copper, nickel, chrome plating of on the order of from 5 ten thousandths to 15 ten thousandths of an inch thickness.

While particular embodiments of the invention have been shown and described in detail, it will be obvious to those skilled in the art that changes and modifications of the present invention, in its various aspects, may be made without departing from the invention in its broader aspects, some of which changes and modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. A protective housing and mounting apparatus for simultaneously protectively enclosing, and mounting to a given surface, a generally cylindrical capacitive-type proximity sensor having a substantially solid and unbroken external surface and an electrode member at one axial end thereof, said protective housing and mounting apparatus comprising: a one-piece integrally formed member of a durable, moldable plastics material, said member including an end surface configured for complementary mounting upon said given surface, a protective body portion extending from said end surface for surroundingly housing an end part of said generally cylindrical capacitive-type proximity sensor proximate said axial end thereof at which said electrode member is located; said body portion having a cylindrical open-ended bore therein for receiving said sensor end part, said bore extending to a point closely spaced behind said end surface; a quantity of conductive material covering substantially all external surfaces of the otherwise integrally formed, moldable plastic body portion and a predetermined portion of said end surface away from the periphery thereof, such that there is no continuity of electrically conductive material between said end surface and said body portion surfaces; and connecting means for establishing electrically conductive contact between the end surface conductive material-covered portion and said electrode of said sensor, such that said end surface portion defines an electrode of selected size and configuration for said sensor.

2. Apparatus according to claim 1 wherein said covering of conductive material comprises a copper, nickel, chrome plating on the order of from five to fifteen ten thousandths of an inch thickness.

3. Apparatus according to claim 1, wherein said plastics material comprises ABS plastic.

4. Apparatus according to claim 1 wherein said electrode portion of said sensor includes an internally threaded bore extending inwardly of said axial end surface and wherein said connecting means comprises a through aperture in the conductive material-covered portion of said housing end surface, located and shaped for alignment in registry with said threaded bore, and a fastener member of conductive material including an elongate shaft having an external thread for complementary mating with said internally threaded bore of said sensor and an enlarged head portion for electrically conductive contact with said conductive material-covered portion of said end surface about said through aperture therein.

5. Apparatus according to claim 1 and furthur including a mounting plate member of non-conductive material for engagement with said end surface and with said given surface to which said sensor is to be mounted.

6. Apparatus according to claim 1 wherein said end surface portion of said integrally formed member is generally rectangular, and wherein said conductive material-covered portion thereof defines a generally geometrically similar, smaller rectangular configuration, substantially centered upon said rectangular end surface so as to leave a surrounding peripheral portion thereof free of said conductive material.

7. Apparatus according to claim 1 wherein said end surface is generally flat for complementary engagement upon a generally flat surface comprising said given surface to which said proximity sensor is to be mounted.

8. Apparatus according to claim 1 wherein said end surface is arcuately curved to generally conform to a similar arcuate curvature of said given surface to which said proximity sensor is to be mounted thereby.

9. An improved proximity sensor comprising a generally cylindrical, capacitive-type sensor element having a substantially solid and unbroken external surface and electrode member at one axial end thereof and a protective housing and mounting apparatus for simultaneously protectively enclosing and mounting said sensor element to a given surface, said protective housing and mounting apparatus further comprising a one-piece integrally formed member of a durable, moldable plastics material, said member including an end surface configured for complementary mounting upon said given surface, a protective body portion extending from said end surface for surroundingly housing an end part of said sensor proximate said axial end thereof at which said electrode member is located, said body portion having a cylindrical bore therein for receiving said sensor end part, said bore extending to a point closely spaced behind said end surface; a quantity of conductive material covering substantially all external surfaces of the body portion and a predetermined interior surface portion of the external surface of said end surface away from the periphery thereof, such that there is no continuity of electrically conductive material between said end surface and said body portion surfaces, and connecting means for establishing electrically conductive contact between the end surface conductive material-covered portion and said electrode of said sensor, such that said end surface portion defines an electrode of selected size and configuration for said sensor.

* * * * *